US006078060A

United States Patent [19]

Shibuya et al.

[11] Patent Number: 6,078,060

[45] Date of Patent: Jun. 20, 2000

[54] ACTIVE MATRIX DISPLAY DEVICES AND METHODS OF MANUFACTURING THE ACTIVE MATRIX DISPLAY DEVICES

[75] Inventors: Tsukasa Shibuya; Atsushi Yoshinouchi, both of Nara; Hongyong Zhang; Nobuo Kubo, both of Kanagawa, all of Japan

[73] Assignees: Semiconductor Energy Laboratory Co., Ltd.; Sharp Kabushiki Kaisha, both of Japan

[21] Appl. No.: 08/933,817

[22] Filed: Sep. 19, 1997

[30] Foreign Application Priority Data

Sep. 21, 1996 [JP] Japan .................................... 8-271461

[51] Int. Cl.[7] ............................ H01L 27/01; H01L 29/04

[52] U.S. Cl. ................................ 257/66; 257/65; 257/64; 257/59; 257/72; 438/286; 438/163

[58] Field of Search ................................ 257/66, 65, 64, 257/59, 72; 438/286, 163

[56] References Cited

U.S. PATENT DOCUMENTS 5,323,042 6/1994 Matsumoto ............................... 257/72
5,712,495 1/1998 Suzawa ..................................... 257/59
5,789,762 8/1998 Koyama et al. .......................... 257/66
5,893,729 4/1999 Roisten et al. .......................... 438/163

*Primary Examiner*—Leo P. Picard
*Assistant Examiner*—Hung Van Duong
*Attorney, Agent, or Firm*—Fish & Richardson, P.C.

[57] ABSTRACT

The invention provides a peripheral drive circuit integrated active matrix LCD device in which thin-film transistors have different characteristics optimized for individual circuits of the active matrix LCD device. A pixel matrix portion includes thin-film transistors, each having offset gate regions 134 and 136 produced in a non-self-alignment manner, an n-channel driver portion includes thin-film transistors, each having lightly-doped regions 128 and 130 produced in a combination of the non-self-alignment manner and a self-alignment manner, and a p-channel driver portion includes thin-film transistors produced in a self-alignment manner. This construction makes it possible to arrange the thin-film transistors having characteristics required by the individual circuits.

5 Claims, 9 Drawing Sheets

ACTIVE MATRIX DISPLAY DEVICES AND METHODS OF MANUFACTURING THE ACTIVE MATRIX DISPLAY DEVICES

BACKGROUND OF THE INVENTION

1. Technical Field of the Invention

The present invention relates generally to the construction of active matrix liquid crystal display (LCD) devices and, more particularly, to active matrix LCD devices integrally incorporating a peripheral drive circuit.

2. Description of the Prior Art

The prior art to which the invention is directed includes a conventionally known active matrix LCD device, in which a few hundred by a few hundred pixel electrodes are arranged in matrix form and thin-film transistors are arranged in individual pixels together with the pixel electrodes. In this kind of LCD device, the thin-film transistors located within the individual pixels control electric charges which are input to and output from the individual pixels.

The prior art also includes a recently developed construction known as a peripheral drive circuit integrated type. In this construction, both pixel matrix and peripheral drive circuit portions are integrally formed on a single glass substrate. The peripheral drive circuit integrated construction is advantageous for its reduced manufacturing costs and compactness of individual devices.

Generally, p- or n-channel thin-film transistors are arranged in a pixel matrix circuit as switching elements, while a peripheral drive circuit is a circuit constructed of p- and n-channel thin-film transistors.

In the manufacture of an active matrix LCD device of the aforementioned peripheral drive circuit integrated type, thin-film transistors to be arranged in its pixel matrix circuit and peripheral drive circuit are produced simultaneously on a single substrate.

The pixel matrix circuit and peripheral drive circuit generally require different transistor characteristics, however. For example, although thin-film transistors arranged in the pixel matrix circuit need not operate at so high speeds, they are required to be able to hold electric charges for the individual pixels, making it essential to have an extremely low off-state current. In contrast, what is most important for thin-film transistors arranged in the peripheral drive circuit are their high-speed operation and/or high-current drawing capabilities. Among them, thin-film transistors used to form a buffer circuit are required to have both high-speed operation and high-current drawing capabilities.

The thin-film transistors arranged in the peripheral drive circuit are also required to be less susceptible to degradation of their characteristics. This is because the higher the operating speed, the more likely to occur the degradation of characteristics.

The n-channel thin-film transistors have a mobility two to three times higher than the p-channel thin-film transistors, making it necessary to devise some provision for compensating for the difference in carrier mobility.

SUMMARY OF THE INVENTION

In view of the foregoing, it is an object of the present invention to provide peripheral drive circuit integrated active matrix LCD devices which operate in a wellbalanced manner, satisfying the aforementioned requirements.

In a first aspect of the invention, as shown in FIGS. 4A and 4B, an active matrix display device comprises a substrate on which a pixel matrix portion 10 and a peripheral drive circuit 11 which includes an n-channel driver portion 12 and a p-channel portion 13 are arranged. A more detailed construction of the active matrix display device is such that the pixel matrix portion 10 includes n-channel thin-film transistors, each having an offset gate region 136, the n-channel driver portion 12 of the peripheral drive circuit 10 includes n-channel thin-film transistors, each having a channel region 138, a drain region 113 and a lightly-doped region formed between the channel region 138 and the drain region 113, the lightly-doped region being doped with impurities which give n-type conductivity at a lower dose than the drain region, wherein a channel region 135 is formed adjacent to one side of the offset gate region 136 while a drain region 110 is formed adjacent to the other side of the offset gate region 136.

As shown in FIGS. 4A and 4B, the peripheral drive circuit 11 includes an n-channel driver portion 12 and a p-channel driver portion 13. Generally, the expression "peripheral drive circuit" is used as including a circuit (generally referred to as a driver circuit) which directly drives the pixel matrix portion as well as a shift register circuit, various information processing circuits and memory circuits. In this specification, however, the peripheral drive circuit refers mainly to a driver circuit. Therefore, the peripheral drive circuit disclosed in this specification is not necessarily required to include all of the aforementioned circuit elements.

In a second aspect of the invention, as shown in FIGS. 4A and 4B, an active matrix display device comprises a substrate on which a pixel matrix portion 10 and a peripheral drive circuit 11 which includes an n-channel driver portion 12 and a p-channel driver portion 13 are arranged, wherein the pixel matrix portion 10 includes n-channel thin-film transistors, each having an offset gate region 136, the n-channel driver portion 12 of the peripheral drive circuit 11 includes n-channel thin-film transistors, each having a channel region 138, a drain region 113 and a lightly-doped region 130 formed between the channel region 138 and the drain region 113, the lightly-doped region being doped with impurities which give n-type conductivity at a lower dose than the drain region 113, and the p-channel driver portion 13 of the peripheral driver circuit 11 includes p-channel thin-film transistors which are not provided with any lightly-doped region, and wherein a channel region 135 is formed adjacent to one side of the offset gate region 136 while a drain region 110 is formed adjacent to the other side of the offset gate region 136.

This construction is characterized in that the thin-film transistors arranged in n-channel and p-channel driver portions 12 and 13 which constitute the peripheral drive circuit have different structures, apparently as shown in FIGS. 4A and 4B. More particularly, the n-channel thin-film transistors, each provided with a lightly-doped region 130 to achieve high reliability, are arranged in the n-channel driver portion 12, while the p-channel thin-film transistors provided with no lightly-doped region are arranged in the p-channel driver portion 13 to achieve a driving capability close to that of the n-channel driver portion. This construction makes it possible to increase the driving capability (which means the capability to drive the pixel matrix portion) of the peripheral drive circuit as a whole and achieve high reliability.

In the construction according to the second aspect of the invention, both the pixel matrix portion and the n-channel driver portion incorporate the n-channel thin-film transistors. They however differ in the density of phosphorus elements contained in their gate electrode regions.

The pixel matrix portion is doped with phosphorus only in a first doping process as shown in FIG. 4B. The gate electrodes are not formed yet in this doping process, but in a later process shown in FIG. 2C. This means that gate electrode regions in the pixel matrix portion are not doped with phosphorus.

In contrast, the n-channel driver portion is doped with phosphorus not only in the first doping process shown in FIG. 1B but also in a second doping process shown in FIG. 3B. In the second doping process, phosphorus is injected into gate electrodes 122 as well as gate electrode regions of anodic oxide films 32 produced around the gate electrodes.

Since the gate electrode regions of the n-channel thin-film transistors formed in the pixel matrix portion are not doped with phosphorus, no phosphorus elements exist in these gate electrode regions (at least at a density exceeding a background level).

On the other hand, phosphorus elements injected in the second doping process of FIG. 3B exist in the gate electrode regions of the n-channel thin-film transistors formed in the n-channel driver portion.

Although the n-channel thin-film transistors of both the pixel matrix portion and the n-channel driver portion commonly contain phosphorus elements in their gate electrode regions, the densities of phosphorus elements differ between the two portions as described above. The density of phosphorus elements contained in the gate electrode regions of the n-channel driver portion is determined by doping conditions in the second doping process of FIG. 3B.

The expression "gate electrode regions" is used in the foregoing discussion because anodic oxide films are formed around the gate electrodes. If such anodic oxide films are not formed and the gate electrodes are exposed when impurities are injected, the gate electrodes themselves become gate electrode regions.

According to the construction of the invention of FIGS. 4A and 4B, the density of impurities (phosphorus in this case) injected into the source region 111 and the drain region 113 of each n-channel thin-film transistor arranged in the peripheral drive circuit is higher than the source region 108 and the drain region 110 of each n-channel thin-film transistor arranged in the pixel matrix portion.

The source and drain regions 108 and 110 in the pixel matrix portion are doped with phosphorus only in the aforementioned first doping process of FIG. 1B. In contrast, the source and drain regions 111 and 113 in the n-channel driver portion are doped with phosphorus in both the first and second doping processes, shown in FIGS. 1B and 3B. This means that the source and drain regions of the n-channel thin-film transistors arranged in the n-channel driver portion of the peripheral drive circuit contains phosphorus elements at a higher density because of the process of FIG. 3B.

The invention also provides, as shown in FIGS. 1A through 4B, a method of manufacturing an active matrix display device in which a pixel matrix portion 10 and a peripheral drive circuit 11 (which includes an n-channel driver portion 12 and a p-channel driver portion 13) are produced on a single substrate 101.

This method comprises the steps of forming source and drain regions 108 and 110 of n-channel thin-film transistors which are arranged in the pixel matrix portion 10 and source and drain regions 111 and 113 of n-channel thin-film transistors which are arranged in the peripheral drive circuit 11 by a non-self-alignment process using a mask as shown in FIG. 1B, simultaneously irradiating the source and drain regions of n-channel thin-film transistors as well as an intrinsic or substantially intrinsic regions (denoted by 109 and 112) which exist between the source and drain regions with laser light, forming gate electrodes of the individual n-channel thin-film transistors as shown in FIG. 2, and forming lightly-doped regions 128 and 130 in n-channel thin-film transistors arranged in the peripheral drive circuit 11 by a self-aligmnent process using the gate electrode 122 as shown in FIG. 3B.

The above manufacturing method may further comprise, after forming the gate electrode as shown in FIG. 2, the step of forming lightly-doped regions 128 and 130 through a self-alignment process, in which an active layer forming each n-channel thin-film transistor arranged in the peripheral drive circuit is doped with impurities as shown in FIG. 3B which give n-type conductivity at a lower dose than used for forming the source and drain regions.

According to this manufacturing method, as shown in FIGS. 4A and 4B, the n-channel thin-film transistors having different structures can be formed in the pixel matrix portion and peripheral drive portion to achieve desired characteristics.

As summarized in the foregoing description, the thin-film transistors formed in the pixel matrix portion, n-channel driver portion and p-channel driver portion have different structures.

That is, each of the n-channel thin-film transistors arranged in the pixel matrix portion includes the source and drain regions 108 and 110 formed by the non-self-alignment process as shown in FIG. 1B and offset gate regions 134 and 136 produced in accordance with a positional relationship between a resist mask 105 and the gate electrode 120 formed in a process of FIG. 2.

The n-channel thin-film transistors thus produced in the pixel matrix portion have a low off-state current characteristic.

Each of the n-channel thin-film transistors arranged in the n-channel driver portion includes the lightly-doped regions 128 and 130 formed by the self-alignment process using a gate electrode 122 (FIG. 3B).

The n-channel thin-film transistors thus produced in the n-channel driver portion have a sufficiently high driving capability and high reliability.

Each of the p-channel thin-film transistors arranged in the p-channel driver portion simply includes offset gate regions 140 and 142 formed by using an anodic oxide film 33 to achieve a high driving capability.

The aforementioned construction serves to achieve a balance in characteristics between the p-channel thin-film transistors arranged in the p-channel driver portion and n-channel thin-film transistors arranged in the n-channel driver portion.

DETAILED DESCRIPTION OF THE PREFERRED EMBODIMENTS

FIRST EMBODIMENT

Figures 1A, 1B, 1C:
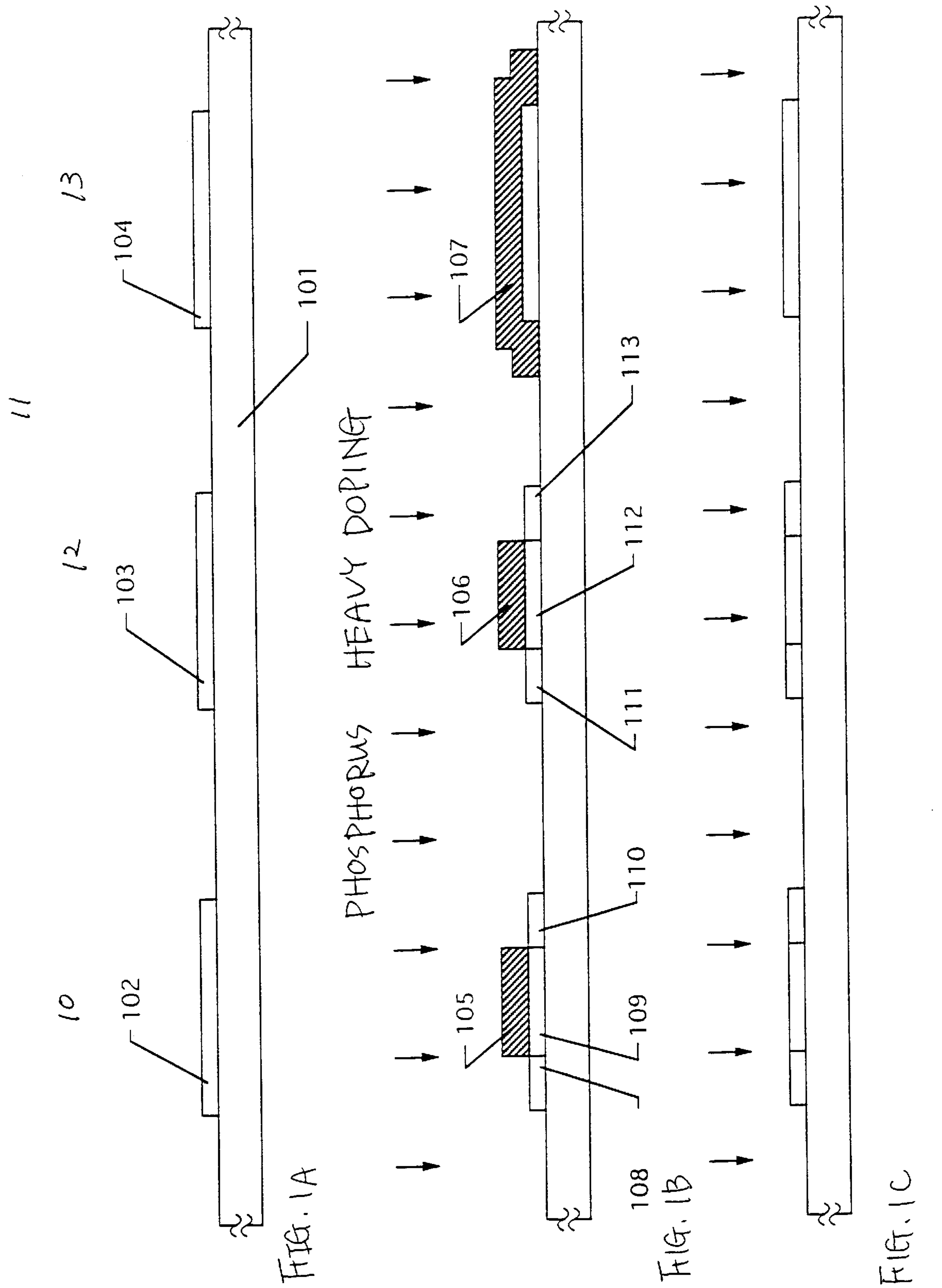
FIGS. 1A to 1C are diagrams showing processes for producing thin-film transistors according to a first embodiment of the invention.

FIGS. 1A–1C, 2A–2C, 3A–3B, 4A–4B, 5A–5B and 6 illustrate manufacturing processes according to a first embodiment of the invention, in which n-channel thin-film transistors to be arranged in a pixel matrix portion 10 and p- and n-channel thin-film transistors which constitute a peripheral drive circuit 11 (buffer circuit) for driving the pixel matrix portion are simultaneously produced on a single glass substrate 101.

In these Figures, an n-channel driver portion 12 refers to n-channel thin-film transistor circuitry which forms part of the peripheral drive circuit 11, while a p-channel driver portion 13 refers to p-channel thin-film transistor circuitry which forms another part of the peripheral drive circuit 11.

In this embodiment, each thin-film transistor is of a top gate type in which a gate electrode is formed above an active layer.

Although the embodiment utilizes the glass substrate 101 as shown in FIG. 1A, it may employ a quartz substrate as an alternative.

First, an unillustrated base film is formed on the glass substrate 101. More particularly, the base film is a 2000 Å thick silicon dioxide film formed by a sputtering process.

Next, an unillustrated amorphous silicon film is formed to a thickness of 500 Å by a plasma chemical vapor deposition (CVD) process. A low-pressure thermal CVD process may be used as an alternative to the plasma CVD process. In this embodiment, an intrinsic or substantially intrinsic (which implies that no conductivity is added) amorphous silicon film is formed.

After forming the unillustrated amorphous silicon film, active layer patterns designated by the numerals 102, 103 and 104 in FIG. 1A are formed by a patterning process. These patterns 102–104 serve as active layers of the individual thin-film transistors. More particularly, the active layer pattern 102 forms an active layer of each thin-film transistor arranged in the pixel matrix portion 10, the active layer pattern 103 forms an active layer of each thin-film transistor arranged in the n-channel driver portion 12, and the active layer pattern 104 forms an active layer of each thin-film transistor arranged in the p-channel driver portion 13. A workpiece shown in FIG. 1A is obtained in the aforementioned manner.

Next, resist masks 105, 106 and 107 are formed as shown in FIG. 1B. The workpiece is then doped with phosphorus under such conditions that are suited for forming source and drain regions of each n-channel thin-film transistor.

Either a plasma doping process or an ion doping process can be used for adding impurities. The plasma doping process is a process in which a gas containing an impurity element such as phosphorus hydride ($PH_3$) or diborane ($B_2H_6$) is turned into a plasma by using high-frequency electricity, and impurity ions are drawn from the plasma by applying an electric field, which accelerates and injects the impurity ions into a desired region.

The ion doping process is a process in which a gas containing an impurity element such as $PH_3$ or $B_2H_6$ is turned into a plasma, and impurity ions are separated from the plasma by a mass separation method using a magnetic field. The impurity ions thus separated are accelerated and injected into a desired region.

Used in the present embodiment is the plasma doping process. FIG. 1B states "heavy doping" with phosphorus. This is because phosphorus is injected at relatively a high dose compared to a second doping process which will be described later. The regions heavily doped with phosphorus in the doping process of FIG. 1B are designated $N^+$ regions.

As can be seen from FIG. 1B, phosphorus ions are not injected into the active layer pattern 104 in this doping process as it is covered with the resist mask 107. Regions 109 and 112 shielded by the resist masks 105, 106 and 107, respectively, are not doped with phosphorus either. The regions 109 and 112 are therefore left as intrinsic (i-type) regions. Regions 108, 110, 111 and 113 are doped with phosphorus and become $N^+$-type regions. (Strictly speaking, these regions are turned into $N^+$-type regions in a later activation process.)

Mask alignment accuracy is important in the doping process of FIG. 1B as it is a non-self-alignment process.

When the process of FIG. 1B has been completed, the resist masks 105, 106 and 107 are removed. At this point, the active layer patterns 102, 103 and 104 are still in an amorphous state.

The workpiece is then irradiated with laser light as shown in FIG. 1C. This laser light irradiation process produces the following effects:

Crystallization of the individual active layer patterns;

Activation of phosphorus injected in the doping process; and

Annealing of areas damaged by the doping with phosphorus (Damages are caused by collisions with ions.)

The laser light irradiation simultaneously causes crystallization and activation of the $N^+$-type regions 108 and 110 as well as crystallization of the i-type region 109 in the pixel matrix portion. In the n-channel driver portion, the laser light irradiation causes simultaneous crystallization and activation of the $N^+$-type regions 111 and 113 as well as crystallization of the i-type region 112. In the p-channel driver portion, the laser light irradiation simply causes crystallization of the active layer pattern 104 since his region is not doped with any impurity ions.

What is important in the process shown in FIG. 1C is that individual junctions boundary regions) between the $N^+$-type and i-type regions and their proximity zones in the pixel matrix and n-channel driver portions are irradiated by the laser light. This is remarkably effective for reducing the density of defects at and close to the junctions.

As will be described later in detail, the thin-film transistors arranged in the pixel matrix portion exhibit an excellent low off-state current characteristic because the aforementioned effects are obtained.

Figures 2A, 2B, 2C:
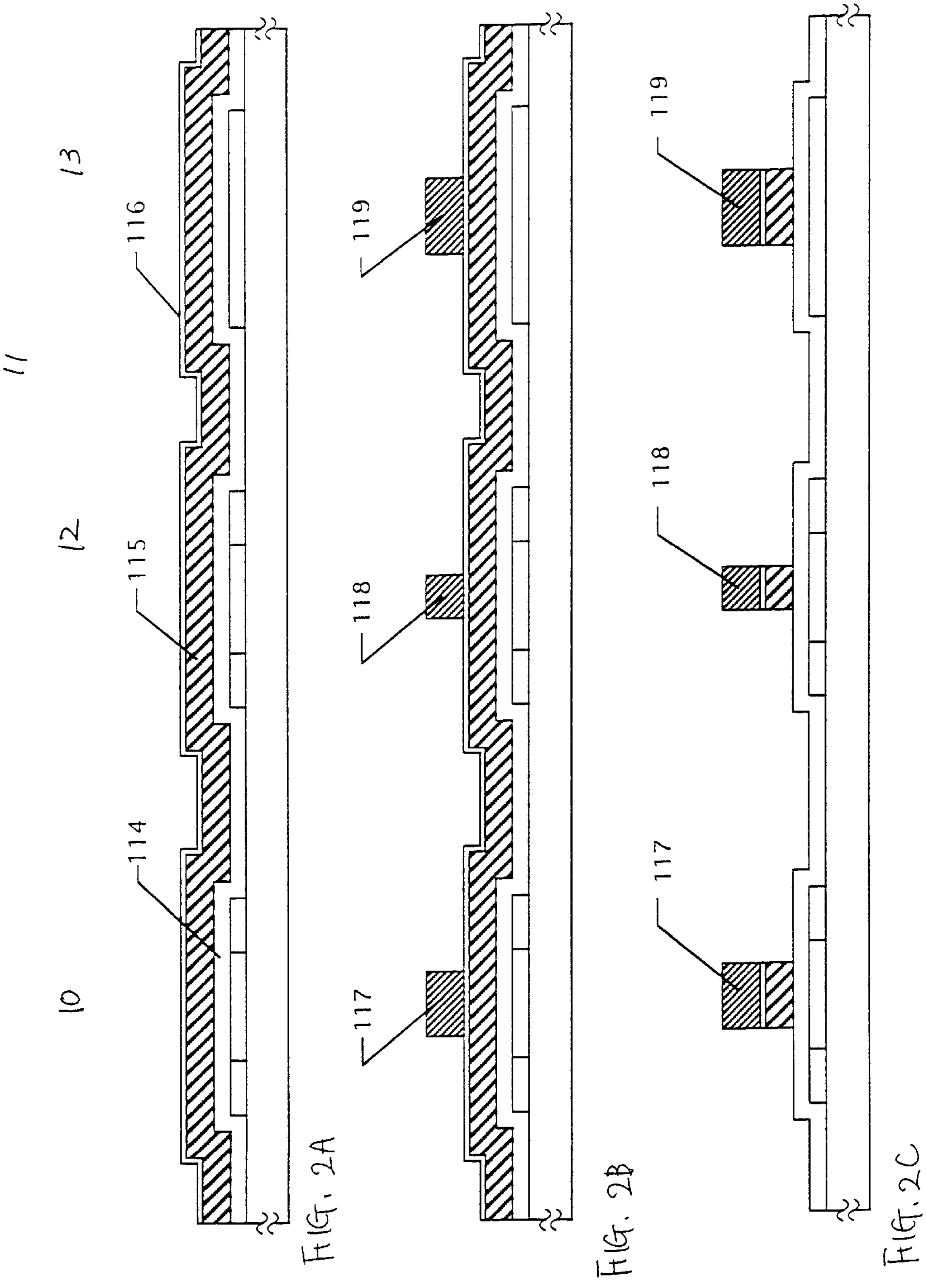
FIGS. 2A to 2C are diagrams showing processes for producing the thin-film transistors according to the first embodiment of the invention.

Next, an aluminum film 115 which will be used for making gate electrodes is formed to a thickness of 4000 Å by a sputtering process, as shown in FIG. 2A.

After forming the aluminum film 115, an anodic oxide film 116 is formed to a thickness of 100 Å by an anodic oxidization method. The anodic oxide film 116 thus produced serves to prevent formation of hillocks and whiskers in later processes. The anodic oxide film 116 also serves to prevent short circuits between gate lines which extend from the gate electrodes and other wirings which are placed above the gate lines. The hillocks and whiskers are filamentary and spiny protuberances, respectively, that are formed due to an abnormal growth of aluminum. The hillocks and whiskers could develop during such processes as heating, laser light irradiation, or doping with an impurity element.

When a workpiece structure shown in FIG. 2A has been produced in the aforementioned manner, resist masks 117, 118 and 119 are formed as shown in FIG. 2B. These resist masks 117–119 are for forming the gate electrodes.

The surface of the workpiece is patterned by using the resist masks 117–119 to obtain a structure shown in FIG. 2C. Then, the resist masks 117–119 are removed to obtain a structure shown in FIG. 3A.

Figure 3A:
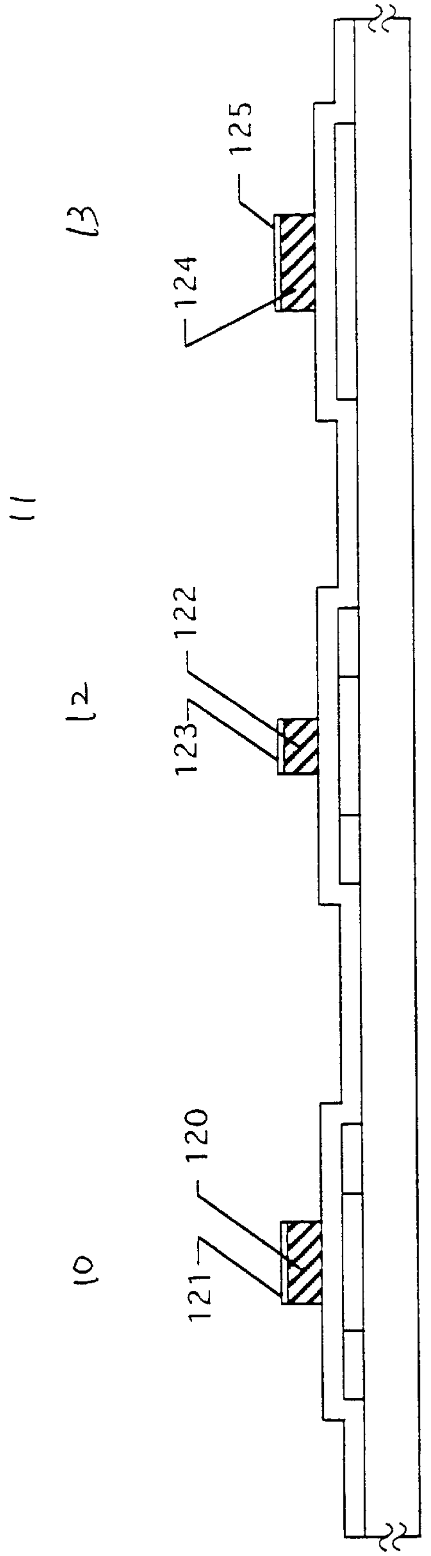
FIGS. 3A and 3B are diagrams showing processes for producing the thin-film transistors according to the first embodiment of the invention.

In the structure shown in FIG. 3A, designated by the numeral 120 is one of gate electrodes of the thin-film transistors formed in the pixel matrix portion, and designated by the numeral 121 is a fragmentary anodic oxide film left on top of that gate electrode 120. Although not illustrated, the gate lines extend from the individual gate electrodes 120, forming a lattice-like pattern together with source lines.

Designated by the numeral 122 in FIG. 3A is one of gate electrodes of the thin-film transistors formed in the n-channel driver portion 12, and designated by the numeral 123 is a fragmentary anodic oxide film left on top of that gate electrode 122.

Designated by the numeral 124 is one of gate electrodes of the thin-film transistors formed in the p-channel driver portion 13, and designated by the numeral 125 is a fragmentary anodic oxide film left on top of that gate electrode 124.

Figure 3B:
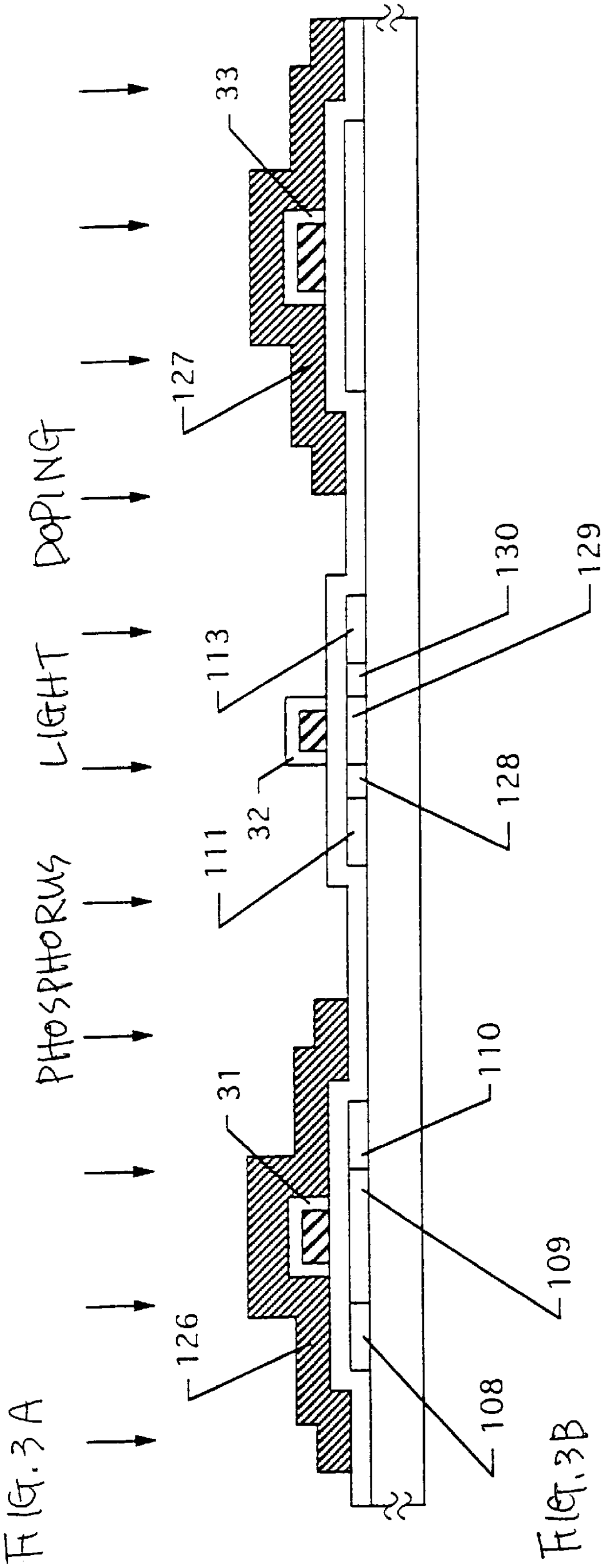

When a structure shown in FIG. 3A has been produced in the aforementioned manner, the workpiece is subjected again to anodic oxidization to form anodic oxide films to a thickness of 1000 Å as indicated by the numerals 31, 32 and 33 in FIG. 3B. These anodic oxide films 31–33 swallow up, or become integrally joined with, the anodic oxide films 121, 123 and 125 shown in FIG. 3A, respectively.

Next, resist masks 126 and 127 are formed as shown in FIG. 3B and the workpiece is subjected to a light doping process, in which phosphorus ions are injected again but at a lower dose compared to the doping process shown in FIG. 1B. In this light doping process, regions 128 and 130 are doped with phosphorus at a lower density than the regions 111 and 113. The regions 128 and 130 are referred to as $N^-$-type. The $N^+$-type regions 111 and 113 which are additionally doped with phosphorus in the light doping process remain as the $N^+$-type regions.

The light doping process depicted in FIG. 3B makes use of the pattern of the gate electrodes 122 and, therefore, it is referred to as a self-alignment process. A main feature of the self-alignment process is that it can be performed without making any dedicated mask. Another feature of the self-alignment process is that it is free from the influence of mask alignment accuracy as there is no need to arrange a mask pattern.

The $N^+$-type regions 111 and 113 and $N^-$-type regions 128 and 130 are formed as described above, wherein the $N^-$-type regions 128 and 130 are formed by using the self-alignment process. As a result of the light doping process of FIG. 3B, the region 111 becomes a source region and the region 113 becomes a drain region. Also, the regions 128 and 130 become lightly-doped regions. Among them, the region 130 adjacent to the drain region 113 becomes a region which is known as a lightly-doped drain (LDD) region. A region designated by the numeral 129 remains as an i-type region since the phosphorus ions are not injected in the light doping process.

When a workpiece structure shown in FIG. 3B has been obtained in the aforementioned manner, the resist masks 126 and 127 are removed. Then, the pixel matrix and n-channel driver portions are covered with resist masks 221 and 222, respectively, as shown in FIG. 4A.

The workpiece is doped with boron (B) in this condition. In this doping process, boron ions are injected into regions 131 and 133 under such conditions that the regions 131 and 133 become source and drain regions, respectively. FIG. 4A states "heavy doping" with boron by analogy with the aforementioned phosphorus ion doping conditions. In the doping process of FIG. 4A, the regions 131 and 133 become $N^+$-type regions as they are doped with boron. On the other hand, a region 132 remains as an i-type region as it is not doped with boron in this process.

Figure 4A:
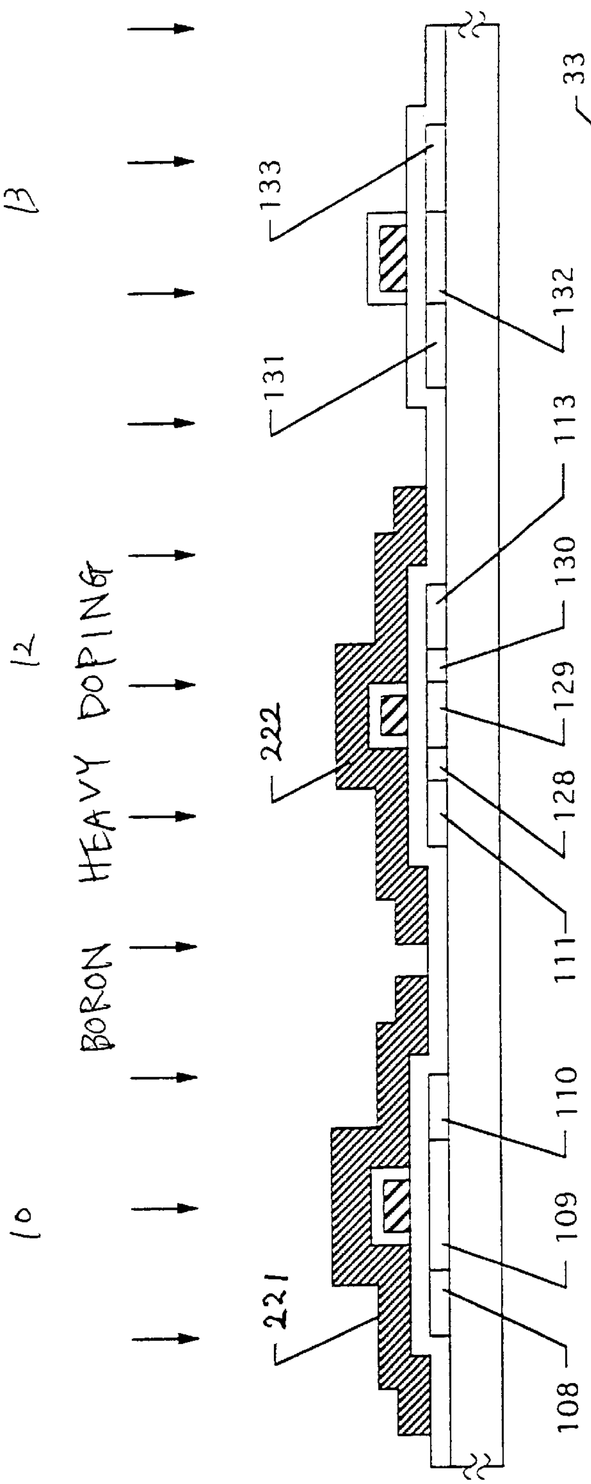
FIGS. 4A and 4B are diagrams showing processes for producing the thin-film transistors according to the first embodiment of the invention.
Figure 4B:
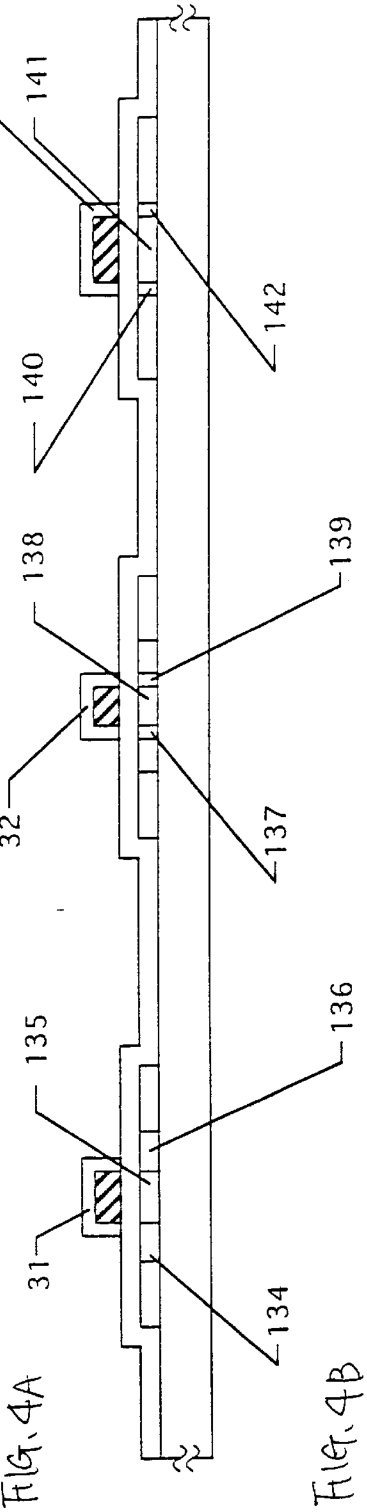

When a workpiece structure shown in FIG. 4A has been obtained in the aforementioned manner, the resist masks 221 and 222 are removed to obtain a structure shown in FIG. 4B.

When the structure shown in FIG. 4B has been obtained, the workpiece is irradiated again with laser light in order to activate the injected impurities and eliminate defects in the crystal structure of the workpiece caused in the doping process.

Since the anodic oxide films 31–33 are formed around the gate electrodes 120, 122 and 124 in the structure of this embodiment, offset gate regions are formed beneath the anodic oxide films 31–33. The offset gate regions located between channel and source regions, and between channel and drain regions, act as high-resistivity regions. These offset gate regions have intrinsic or substantially intrinsic conductivity as do the individual channel regions. The offset gate regions are such high-resistivity regions that do not act as channels, source or drain regions when the thin-film transistors are being operated.

FIG. 4B shows the offset gate regions (high-resistivity regions) having the same thickness as the anodic oxide films 32 and 33. More particularly, designated by the numerals 137 and 139 are offset gate regions grown to the same thickness as the anodic oxide film 32, and designated by the numerals 140 and 142 are offset gate regions grown to the same thickness as the anodic oxide film 33. Regions designated by the numerals 134 and 136 also act as offset gate regions (high-resistivity regions). These regions 134, 136 have such physical dimensions that are determined by a dimensional difference and positional relationship between the resist mask 105 in the process of FIG. 11 and the resist mask 117 in the process of FIG. 2C, in addition to the thickness of the anodic oxide film 31.

Figure 5A:
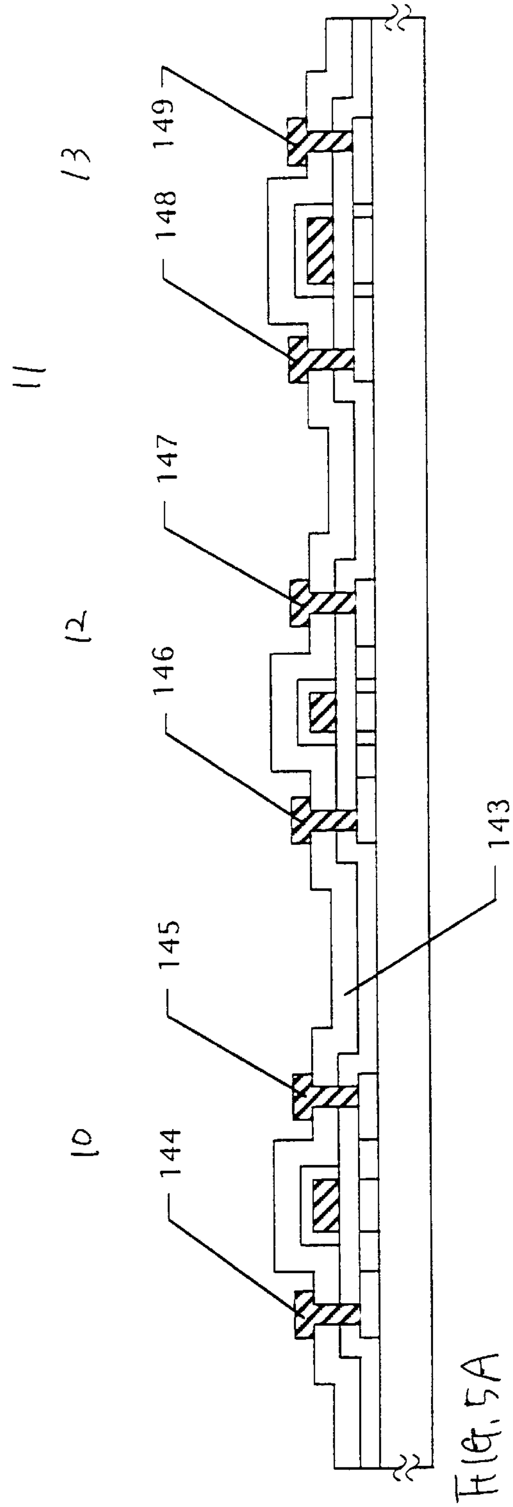
FIGS. 5A and 5B are diagrams showing processes for producing the thin-film transistors according to the first embodiment of the invention.

When a workpiece structure shown in FIG. 4B has been obtained, a first interlayer insulating film 143 is formed as shown in FIG. 5A. In this embodiment, the first interlayer insulating film 143 is formed of a 3000 Å thick silicon nitride film produced by a plasma CVD process. Then, contact holes are made in the workpiece and an unillustrated metallic film for making contact electrodes is produced. More particularly, the metallic film is produced by depositing a titanium film, an aluminum film and another titanium film in a three-layer structure by a sputtering process. The multilayer metallic film is patterned to form electrodes 144 through 149 shown in FIG. 5A.

Referring to FIG. 5A, designated by the numeral 144 is a source electrode connected to a source region of one of the thin-film transistors (n-channel thin-film transistors in this embodiment) arranged in the pixel matrix portion 10, and designated by the numeral 145 is a drain electrode connected to a drain region of one of the thin-film transistors arranged in the pixel matrix portion 10.

Designated by the numeral 146 is a source electrode connected to the source region of one of the thin-film transistors arranged in the n-channel driver portion 12, and designated by the numeral 147 is a drain electrode connected to the drain region of one of the thin-film transistors arranged in the n-channel driver portion 12.

Designated by the numeral 148 is a source electrode connected to the source region of one of the thin-film transistors arranged in the p-channel driver portion 13, and designated by the numeral 149 is a drain electrode connected to the drain region of one of the thin-film transistors arranged in the p-channel driver portion 13.

When a workpiece structure shown in FIG. 5A has been obtained, a second interlayer insulating film 150 is made by forming again a silicon nitride film as thick as 2000 Å by a plasma CVD process. Then, a third interlayer insulating film 151 is formed with polyimide by performing a spin coating process.

Figure 5B:
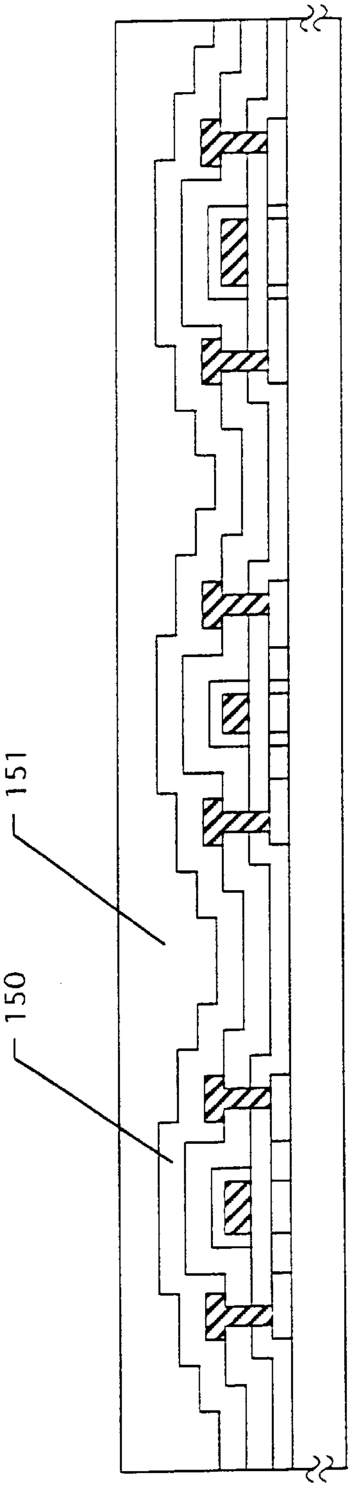
Figure 6:
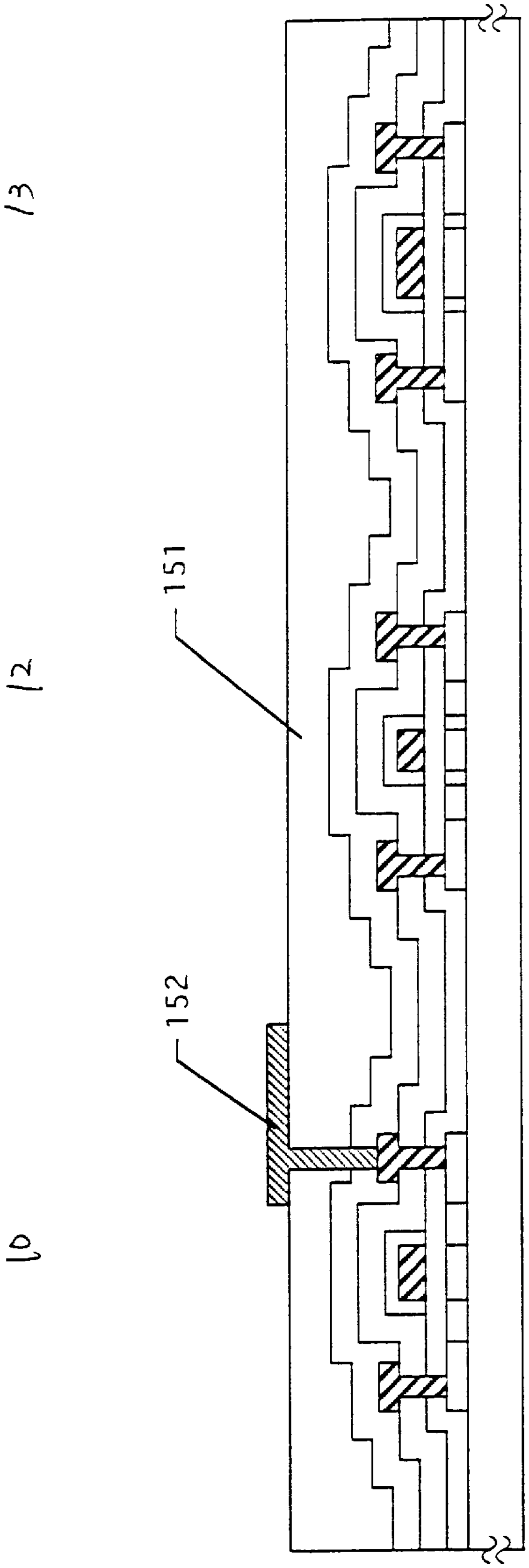
FIG. 6 is a diagram showing a final process for producing the thin-film transistors according to the first embodiment of the invention.

A workpiece structure shown in FIG. 5B is produced in the aforementioned manner. Subsequently, contact holes are made in the workpiece and pixel electrodes 152 are produced as shown in FIG. 6. The pixel electrodes 152 are made by forming an indium tin oxide (ITO) film as thick as 1000 Å by a sputtering process and patterning it to a desired form.

Lastly, the workpiece is heat-treated in a hydrogen atmosphere at 350° C. for a period of one hour to eliminate defects in each semiconductor layer.

One of a pair of substrate assemblies of an LCD panel is made through the above-described processes. The substrate assembly thus produced is also referred to as a TFT substrate. Subsequently, an alignment layer carrying rubbing lines for aligning liquid crystal molecules and a sealing material are formed on the TFT substrate, which is then bonded to an opposed substrate which is separately produced. The LCD panel is completed by injecting a liquid crystal in between the TFT substrate and the opposed substrate.

In the present embodiment, the thin-film transistors of different structures are arranged in the pixel matrix portion 10, n-channel driver portion 12 and p-channel driver portion 13.

In the pixel matrix portion 10, the thin-film transistors having a low off-state current characteristic are produced by laser annealing as shown in FIG. 1C. More particularly, it is possible to produce a construction free from high concentrations of defects at junctions between channel regions 135 and the offset gate regions 136 by performing a laser annealing process depicted in FIG. 1C. This serves to achieve the low off-state current characteristic.

An off-state current, which is of greatest concern with each thin-film transistor arranged in the pixel matrix portion 10, flows as charge carriers migrate by way of defects existing near a boundary area between a channel region 135 and a drain region 110 due to a high electric field formed between the two regions. According to the above-described first embodiment, it is possible to prevent high concentrations of defects near the boundary area (where the offset gate region 136 exists in this embodiment) between the channel and drain regions of each thin-film transistor by using the novel laser annealing process.

In addition, the offset gate region 136 formed between the channel region 135 and drain region 110 of each thin-film transistor decreases the strength of the electric field formed between the latter two regions. This makes it possible to produce thin-film transistors which draw a yet lower off-state current.

It should be recognized from the foregoing discussion that the thin-film transistors arranged in the pixel matrix portion 10 have a novel construction for reducing the off-state current in two ways.

In the n-channel driver portion 12, it is possible to achieve high reliability by forming the lightly-doped regions 128 and 130. More particularly, provision of the lightly-doped regions 128 and 130 (especially the region 130) serves to decrease the strength of an electric field formed between a channel region 138 and the drain region 113 and suppress deterioration due to the hot carrier effect. (Prevention of the deterioration is more important than the reduction in the off-state current in this case.)

The lightly-doped regions 128 and 130 have the same function as the offset gate regions. The lightly-doped regions 128 and 130 do not decrease the driving capability of each thin-film transistor so much, however, because these regions 128, 130 have a lower sheet resistance than the offset gate regions. This means that the present invention provides a construction featuring an increased reliability without causing a large reduction in the driving capability.

The peripheral drive circuit 11 is required to have a high-speed operating capability as well as a high driving capability (which means the capability of drawing a large current). It is therefore desirable to form the lightly-doped regions 128 and 130 compared to provision of offset gate regions which would increase the resistance between the source and drain regions 111, 113 and decrease the driving capability (whereby an on-current is decreased).

The construction of the p-channel driver portion 13 is such that only the offset gate regions 140 and 142 are formed (without forming any lightly-doped regions) by the use of the anodic oxide film 33 so that the driving capability of each thin-film transistor does not decrease.

Generally speaking, a p-channel thin-film transistor has a lower driving capability than an n-channel thin-film transistor. It is therefore desirable to employ the aforementioned construction for achieving an overall balance of characteristics between the p-channel thin-film transistors and n-channel thin-film transistors.

The amount of off-state current is not of great importance for the peripheral drive circuit, and the p-channel thin-film transistors are free from the influence of deterioration due to the hot carrier effect. Therefore, the p-channel driver portion does not require any offset gate structure, which is provided in the pixel matrix portion, or any lightly-doped regions, which are provided in the n-channel driver portion.

As can be understood from the foregoing description, the construction according to the first embodiment of the invention makes it possible to integrally form the following circuit elements on the same glass substrate 101:

- Pixel matrix portion featuring the low off-state current characteristic;
- N-channel driver portion which is suited for high-speed operation and has high reliability; and
- P-channel driver portion which is suited for high-speed operation and provides a good balance of characteristics with the n-channel driver portion.

SECOND EMBODIMENT

A second embodiment of the invention described below is a modified form of the first embodiment. As can be seen from FIG. 3B, the lightly-doped regions 128 and 130 having the same physical dimensions are formed in the n-channel driver portion 12 in the construction of the first embodiment. These lightly-doped regions 128, 130 are formed for improving the reliability with minimal deterioration in high-frequency characteristics and driving capability. Such effect (i.e., deterioration preventing effect) is however exerted by the lightly-doped region 130 located close to the drain region 113. It is therefore no exaggeration to say that the lightly-doped region 128 is not required in actuality.

If the lightly-doped region 128 does not really prevent performance deterioration of each n-channel thin-film transistor, it may simply be an element which adversely affects the high-frequency characteristics and driving capability.

What is characteristic of the second embodiment is the construction of its n-channel driver portion 12, in which the length of a lightly-doped region located close to a drain region is made larger than that of a lightly-doped region located close to a source region (as measured in a direction connecting source, channel and drain regions) in each n-channel thin-film transistor. More particularly, the lightly-doped region 128 located close to the source region is grown to such a length that would be sufficient to absorb mask alignment errors which would occur when forming gate electrodes. This construction helps reduce the influence of the existence of each lightly-doped region to the high-frequency characteristics and driving capability of each n-channel thin-film transistor as well as the influence of the mask alignment errors to transistor characteristics.

FIGS. 7A–7B, 8A–8B and 9A–9B illustrate manufacturing processes according to the second embodiment, in which elements identical or equivalent to those shown in FIGS. 1A–1C, 2A–2C, 3A–3B, 4A–4B, 5A–5B and 6 are designated by the same reference numerals. To add, processes used in the second embodiment in producing the individual elements are same as used in the first embodiment unless specifically mentioned.

Figures 7A, 7B, 7C:
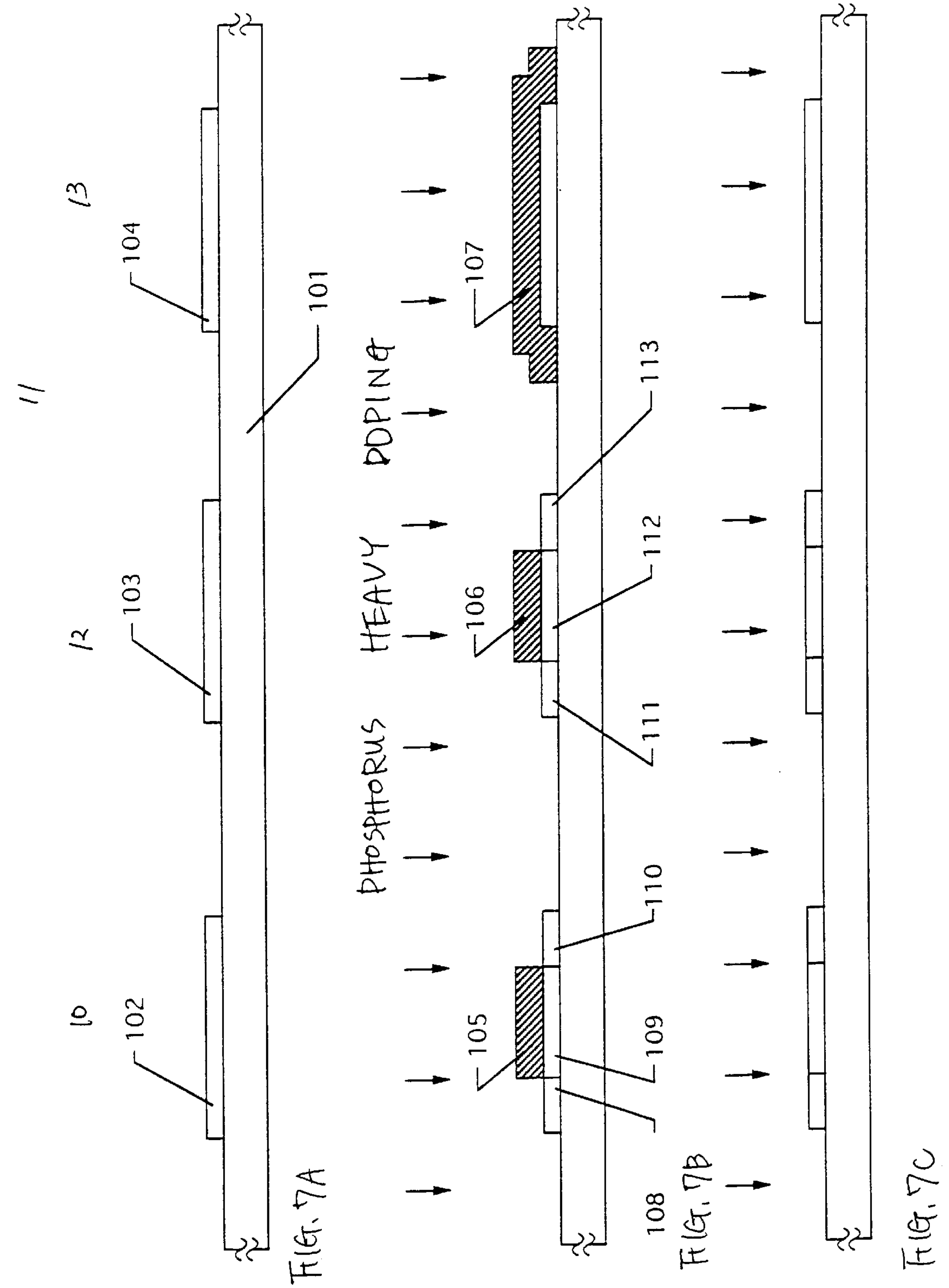
FIGS. 7A to 7C are diagrams showing processes for producing thin-film transistors according to a second embodiment of the invention.

First, active layer patterns 102, 103 and 104 formed of amorphous silicon films are produced on a glass substrate 101 as shown in FIG. 7A, and resist masks 105, 106 and 107 are formed on top of the active layer patterns 102, 103 and 104 to obtain a workpiece as shown in FIG. 7B. The workpiece is then doped with phosphorus to form $N^+$-type regions designated by the numerals 108, 110, 111 and 113 by using the resist masks 105, 106 and 107.

Next, the resist masks 105 and 106 are removed and the workpiece is subjected to a laser annealing process as shown in FIG. 7C, whereby the active layer patterns 102, 103 and 104 are crystallized and phosphorus ions injected in the process of FIG. 7B are activated.

Figure 8A:
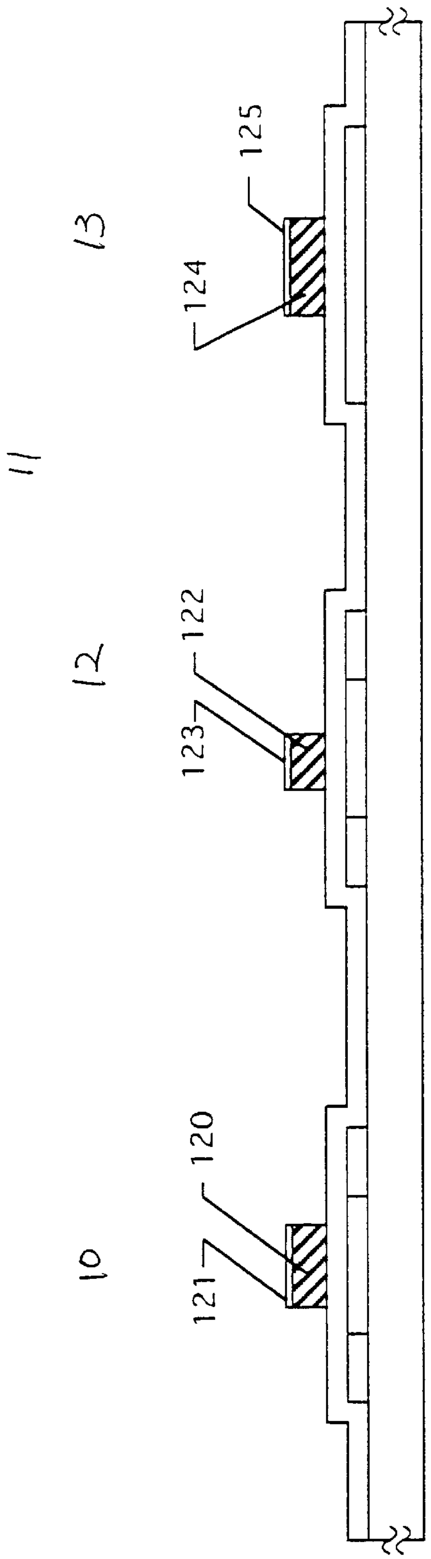
FIGS. 8A and 8B are diagrams showing processes for producing the thin-film transistors according to second embodiment of the invention.

Then, gate electrodes 120, 122 and 124 are formed as shown in FIG. 8A. These gate electrodes 120, 122, 124 are produced by using basically the same process as illustrated in FIGS. 2A–2C. What differs from the first embodiment is the location of the gate electrode 122. As can be seen from FIG. 8A, the gate electrode 122 is slightly displaced toward the source region 111 in the second embodiment. With this arrangement, it becomes possible to make the length of a lightly-doped region 130 located close to the drain region 113 larger than that of a lightly-doped region 128 located close to the source region 111 in a later process.

Figure 8B:
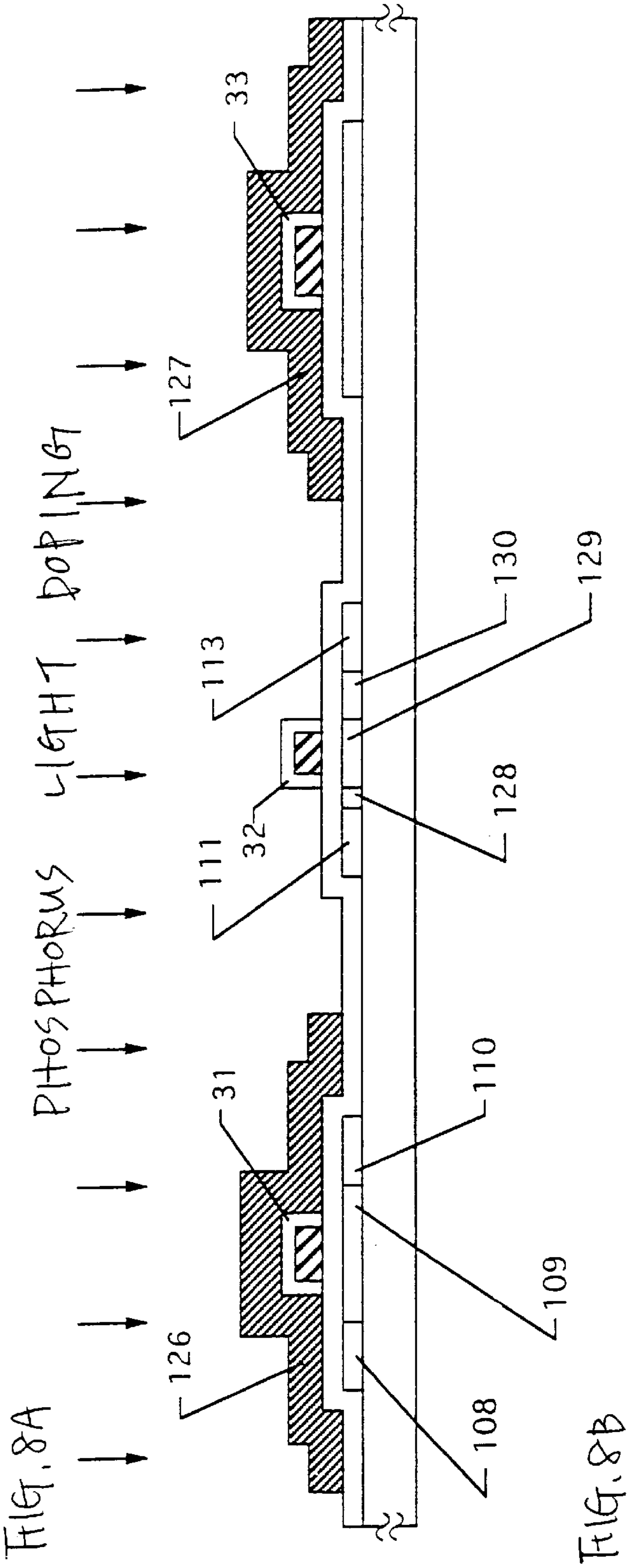

When a structure shown in FIG. 8B has been obtained, the workpiece is subjected to a light doping process, in which phosphorus ions are injected at a lower dose compared to the doping process shown in FIG. 7B. The lightly-doped regions 128 and 130 are formed through this light doping process.

In this embodiment, the length of the lightly-doped regions 130 located close to the drain region 113 is made larger than that of the lightly-doped regions 128 located close to the source region 111 (as measured in the direction connecting the source and drain regions 111, 113). Also, the length of the lightly-doped region 128 is made larger than a dimension corresponding to mask alignment accuracy applied to the formation of the gate electrode 122. This arrangement makes it possible to avoid the influence of any mask alignment errors to the characteristics of n-channel thin-film transistors should such errors ever occur.

Figure 9A:
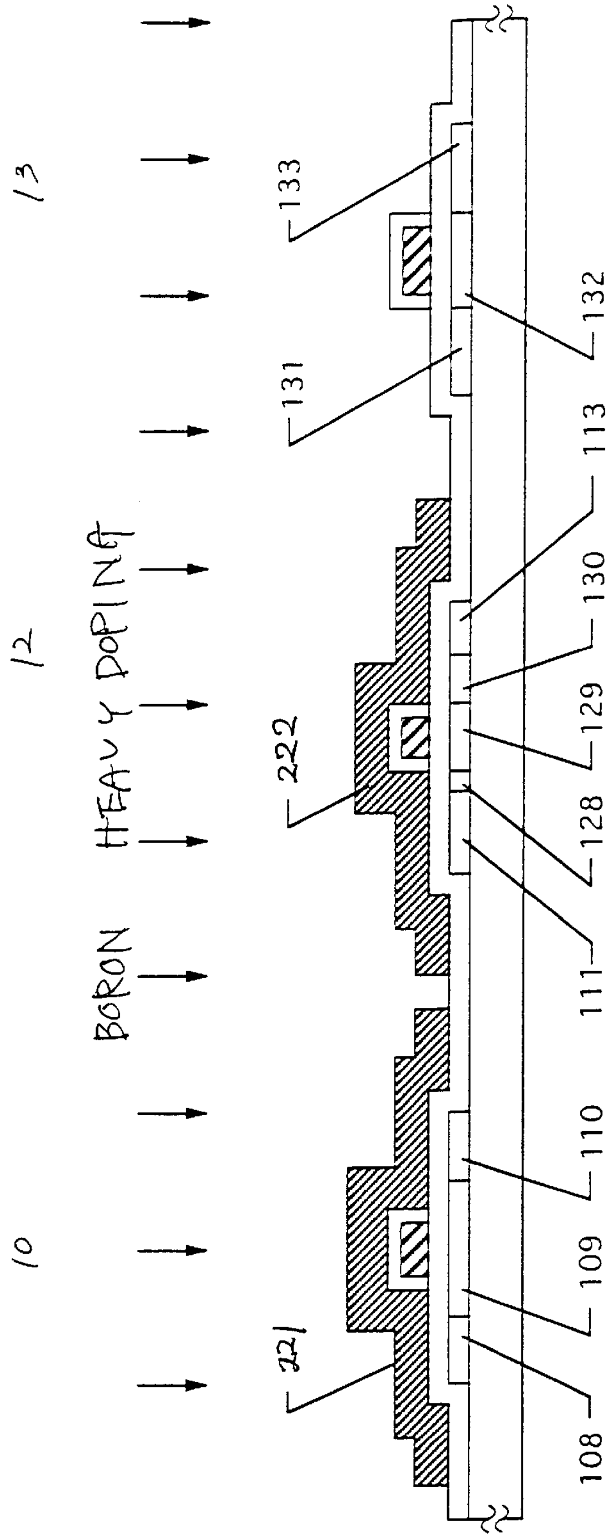
FIGS. 9A and 9B are diagrams showing processes for producing the thin-film transistors according to the second embodiment of the invention.

Subsequently, resist masks 221 and 222 are formed and the workpiece is doped with boron as shown in FIG. 9A. In this doping process, boron ions are injected into a p-channel driver portion 13, whereby a source region 131 and a drain region 133 are produced in the p-channel driver portion 13.

Figure 9B:
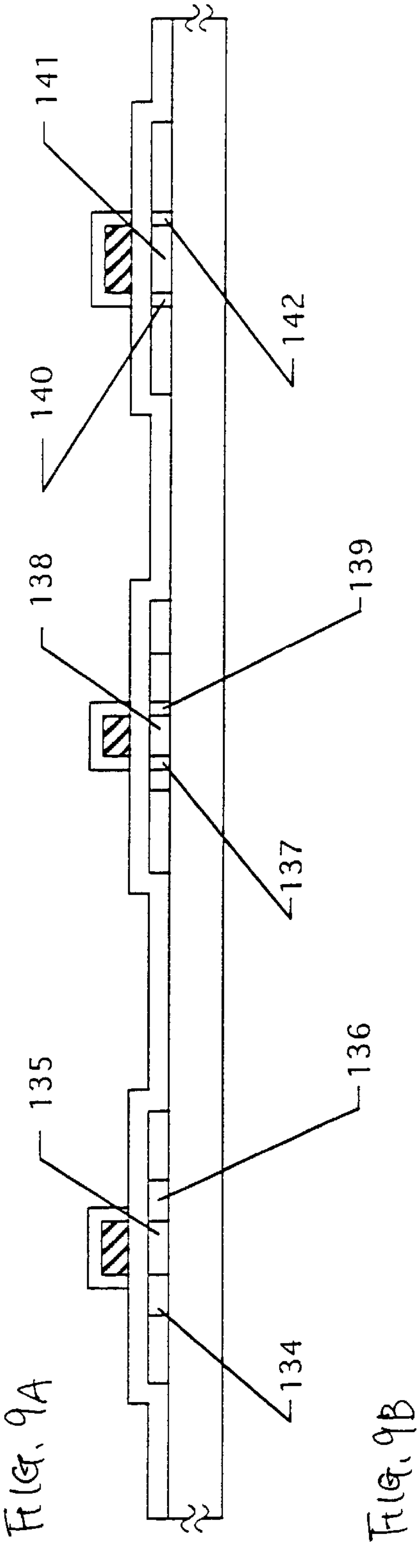

The resist masks 221 and 222 are removed to obtain a structure shown in FIG. 9B. Thereafter, the workpiece is subjected to succeeding processes similar to those described with reference to the first embodiment to complete a construction in which the pixel matrix portion 10, n-channel driver portion 12 and p-channel driver portion 13 are integrally formed on the same glass substrate 101.

According to the construction of this embodiment, it is possible to produce the lightly-doped drain (LDD) region 130 having a sufficient physical dimension close to the drain region 113 where such LDD region is required. This construction serves to add high reliability to the n-channel driver portion 12. Furthermore, it is possible to minimize degradation of the driving capability of each n-channel thin-film transistor in the n-channel driver portion 12 by reducing the physical dimension of the lightly-doped drain region 128 close to the source region 111 which does not make any particular contribution toward achieving the high reliability.

The present invention makes it possible to provide a peripheral drive circuit integrated active matrix LCD device in which thin-film transistors having differing characteristics from one portion to another need to be integrally produced.

In the pixel matrix portion, a thin film transistor having a low off current characteristics can be formed.

In the n-channel driver portion, another thin film transistor having both a high reliability and a high driving capability can be formed.

In the p-channel driver portion, another thin film transistor having a high driving capability in accordance with the thin film transistor in the n-channel driver portion can be obtained.

The present invention is applicable not only to active matrix LCD panels but also to other types of active matrix flat-panel displays such as active matrix displays employing electroluminescent display devices.

What is claimed is:

1. An active matrix display device including a pixel matrix portion and a peripheral drive circuit formed over a single substrate, said device comprising:

a first n-channel thin film transistor formed in said pixel matrix portion, said first n-channel thin film transistor having a first channel forming region, first source and drain regions; and a second n-channel thin film transistor formed in said peripheral drive circuit, said second thin film transistor having: a second channel forming region, second source and drain regions;

a first lightly-doped region between said second source region and said second channel forming region, and a second lightly-doped region between said second channel forming region and said second drain region, wherein said first and second lightly-doped regions comprise an n-type impurity at a lower concentration than said second drain region, wherein said second lightly-doped region has a longer length than said first lightly-doped region.

2. An active matrix display device including a pixel matrix portion and a peripheral drive circuit formed over a single substrate, said device comprising:

a first n-channel thin film transistor formed in said pixel matrix portion, said first n-channel thin film transistor having a first channel forming region, first source and drain regions;

a second n-channel thin film transistor formed in said peripheral drive circuit, said second thin film transistor having: a second channel forming region, second source and drain regions, a first lightly-doped region between said second source region and said second channel forming region;

a second lightly-doped region between said second channel forming region and said second drain region, wherein said first and second lightly-doped region comprise an n-type impurity at a lower concentration than said second drain region; and a p-channel thin film transistor formed in said peripheral drive circuit, said p-channel thin film transistor not having a lightly-doped region, wherein said second lightly-doped region has a longer length than said first lightly-doped region.

3. An active matrix display device according to claim 1, wherein each of said first and second n-channel thin film transistors and said p-channel thin film transistor is a top gate type thin film transistor, and wherein a first gate electrode portion of said first n-channel thin film transistor in said pixel matrix portion comprises phosphorus at a different content from a second gate electrode portion of said second n-channel thin film transistor in said peripheral drive circuit.

4. An active matrix display device according to claim 1, wherein each of said first and second n-channel thin film transistors and said p-channel thin film transistor is a top gate type thin film transistor, and wherein a first gate electrode portion of said first n-channel thin film transistor in said pixel matrix portion is not doped with phosphorus while a second gate electrode portion of said second n-channel thin film transistor in said peripheral drive circuit is doped with phosphorus.

5. An active matrix display device according to claim 1 wherein said first source and drain region of said first n-channel thin film transistor in said pixel matrix portion comprise an n-type impurity at a lower concentration than said second source and drain regions of said second n-channel thin film transistor in said peripheral drive circuit.

* * * * *